United States Patent [19]
Eliason et al.

[11] Patent Number: 6,141,237
[45] Date of Patent: Oct. 31, 2000

[54] FERROELECTRIC NON-VOLATILE LATCH CIRCUITS

[75] Inventors: Jarrod Eliason, Colorado Springs; William F. Kraus, Palmer Lake, both of Colo.

[73] Assignee: Ramtron International Corporation, Colorado Springs, Colo.

[21] Appl. No.: 09/351,563

[22] Filed: Jul. 12, 1999

[51] Int. Cl.$^7$ .................................................. G11C 11/22
[52] U.S. Cl. .................. 365/145; 365/190; 365/194; 365/205
[58] Field of Search .................... 365/145, 149, 365/190, 194, 205; 327/207, 55, 57

[56] References Cited

U.S. PATENT DOCUMENTS

| | | | |
|---|---|---|---|
| 4,918,654 | 4/1990 | Eaton, Jr. et al. | 365/145 |
| 5,237,533 | 8/1993 | Papaliolios | 365/207 |
| 5,406,510 | 4/1995 | Mihara et al. | 365/145 |
| 5,487,029 | 1/1996 | Kuroda | 365/145 |
| 5,550,770 | 8/1996 | Kuroda | 365/145 |
| 5,751,627 | 5/1998 | Ooishi | 365/145 |
| 5,815,431 | 9/1998 | Chen | 365/145 |
| 5,892,712 | 4/1999 | Hirose et al. | 365/187.07 |
| 5,896,042 | 4/1999 | Nishimura et al. | 326/48 |
| 5,901,088 | 5/1999 | Kraus | 365/185.21 |
| 5,923,184 | 7/1999 | Ooms et al. | 365/50 |
| 5,926,412 | 7/1999 | Evans et al. | 365/145 |
| 5,939,903 | 8/1999 | Lin | 327/57 |
| 5,943,268 | 8/1999 | Nguyen | 365/185.29 |
| 6,002,634 | 12/1999 | Wilson | 365/230.06 |
| 6,008,659 | 12/1999 | Traynor | 324/658 |

*Primary Examiner*—Richard Elms
*Assistant Examiner*—Hien Nguyen
*Attorney, Agent, or Firm*—Peter J. Meza, Esq.; Carol W. Burton, Esq.

[57] ABSTRACT

A non-volatile ferroelectric latch includes a sense amplifier having at least one input/output coupled to a bit-line node, a ferroelectric storage capacitor coupled between a plate-line node and the bit-line node, and a load element coupled to the bit-line node. The sense amplifier further includes a second input/output coupled to a second bit-line node and the latch further includes a second ferroelectric storage capacitor coupled between a second plate-line node and the second bit-sine node, and a second load element coupled to the second bit-line node. The load element includes a dynamic, switched ferroelectric capacitor a static, nonswitched ferroelectric capacitor, a linear capacitor, or even a resistive load.

29 Claims, 13 Drawing Sheets

UP-ONLY TIMING WITH DYNAMIC LOAD POLARIZATION

UP-DOWN TIMING WITH STATIC FERROELECTRIC LOAD

UP-ONLY TIMING WITH STATIC FERROELECTRIC LOAD

FERROELECTRIC NON-VOLATILE LATCH CIRCUITS

BACKGROUND OF THE INVENTION

This invention relates generally to latch circuits. More particularly, the present invention relates to latch circuits including a non-volatile ferroelectric storage element.

Electrically programmable non-volatile information storage has been realized for some time using floating-gate charge storage mechanisms as in EPROM, EEPROM and FLASH memories. Although these technologies provide non-volatility, they require long programming times and high programming voltages. Additionally, the maximum number of read/write cycles is limited to about one hundred thousand ($10^5$) cycles.

More recently, programmable non-volatile memories have been realized using ferroelectric materials such as lead zirconate titanate (PZT). Ferroelectric materials exhibit two stable polarization states that can be set and interrogated using standard logic voltage levels. Furthermore, ferroelectric memories are significantly faster than floating-gate memories, require less power to program, and can be reprogrammed many more times by several orders of magnitude (between $10^{10}$ and $10^{15}$ read/write cycles for existing memories). As such, ferroelectric memory is a rapidly developing technology in which much research and product development is currently being conducted.

Most ferroelectric memory development efforts to date have focused on memory chips and blocks of embedded memory. However, many common system and integrated circuit designs would also benefit greatly from the availability of autonomous non-volatile memory bits. Some potential uses include, but are not limited to, failed address storage for memory redundancy, post-production trimming of programmable current sources, logic circuit backup, and non-volatile registers. Previously, prior art circuits have been designed which realize autonomous bits of non-volatile memory. In these designs, however, no consideration has been given to important load issues or latch timing considerations.

What is desired, therefore, is a non-volatile latch circuit in which these important load issues and latch timing considerations are fully addressed.

SUMMARY OF THE INVENTION

It is, therefore, a principal object of the present invention to provide a performance optimized non-volatile ferroelectric latch circuit.

It is an advantage of the invention that, when used in an integrated circuit, the latch circuit of the present invention allows modifications to logic, data, or analog circuits after fabrication and testing, and even after packaging. Potential uses include: memory redundancy, serial number storage, security data storage, programmable current sources, and the like.

It is another advantage of the invention that compared to laser-blown fuses, which are large and require slow physical programming that is write-once, a ferroelectric non-volatile latch according to the present invention is smaller and uses faster electrical writes that can be modified.

It is yet another advantage of the invention that compared to EEPROM or FLASH memory, which require an elevated programming voltage, the ferroelectric non-volatile latch according to the present invention can be programmed with normal level power supply voltages.

According to the present invention a non-volatile ferroelectric latch includes a sense amplifier having at least one input/output coupled to a bit-line node, a ferroelectric storage capacitor coupled between a plate-line node and the bit-line node, and a load element coupled to the bit-line node. The sense amplifier further includes a second input/output coupled to a second bit-line node and the latch further includes a second ferroelectric storage capacitor coupled between a second plate-line node and the second bit-line node, and a second load element coupled to the second bit-line node. The load element includes a dynamic, switched ferroelectric capacitor a static, nonswitched ferroelectric capacitor, a linear capacitor, or even a resistive load.

The foregoing and other objects, features and advantages of the invention will become more readily apparent from the following detailed description of a preferred embodiment of the invention which proceeds with reference to the accompanying drawings.

DETAILED DESCRIPTION

Three separate sensing methods are referred to throughout the following ferroelectric non-volatile latch descriptions. These three methods are referred to as "while-up", "up-only" and "up-down." This terminology refers to the timing relationship between the latching of the circuit to the interrogation of the ferroelectric storage capacitor. The storage capacitor is interrogated by the pulsing of a plate-line. If the latch circuit, which also includes a sense amplifier, is active before or during the plate pulsing, the sensing method is referred to as "while-up." This timing condition is shown in the first portion of FIG. 1. If the plate is pulsed to its maximum voltage level before the sense amplifier is activated, the sensing method is referred to as "up-only." This timing condition is shown in the second portion of FIG. 1. If the plate-line is pulsed high and then returned to ground level before the sense amplifier is activated, the sensing method is referred to as "up-down." This timing condition is shown in the third and last portion of FIG. 1.

In conventional ferroelectric memories, up-down sensing has been found to be more reliable than up-only sensing, and while-up sensing is not generally practiced. The operation of while-up sensing relies on the ability of the ferroelectric storage capacitors to force the active latch circuit into the correct state, whereas up-only and up-down sensing allow time for some initial signal based solely on ferroelectric capacitor polarization to be established prior to latch activation. Even in while-up sensing, care should be taken to ensure that the active latch is not strongly amplifying until sufficient signal has been established by the storage capacitors. Thus, in its preferred implementation, while-up sensing imitates up-only sensing but does not use staggered timing signals.

Each design except latch circuit 20 and latch circuit 40 incorporates "while-up" sensing. The term "while-up" distinguishes the actual operation from the term "up-only." The latch circuit 20 design uses either "up-only" or "while-up" sensing, depending on the amount of time between the fall of PLGOB and the rise of VDDP. (Please note that all circuit node and signal names are further described in a GLOSSARY that appears at the end of this detailed description of the invention.) The latch circuit 40 design uses either "up-down" or "up only" sensing, depending on when latching occurs.

Figures 1, 2:
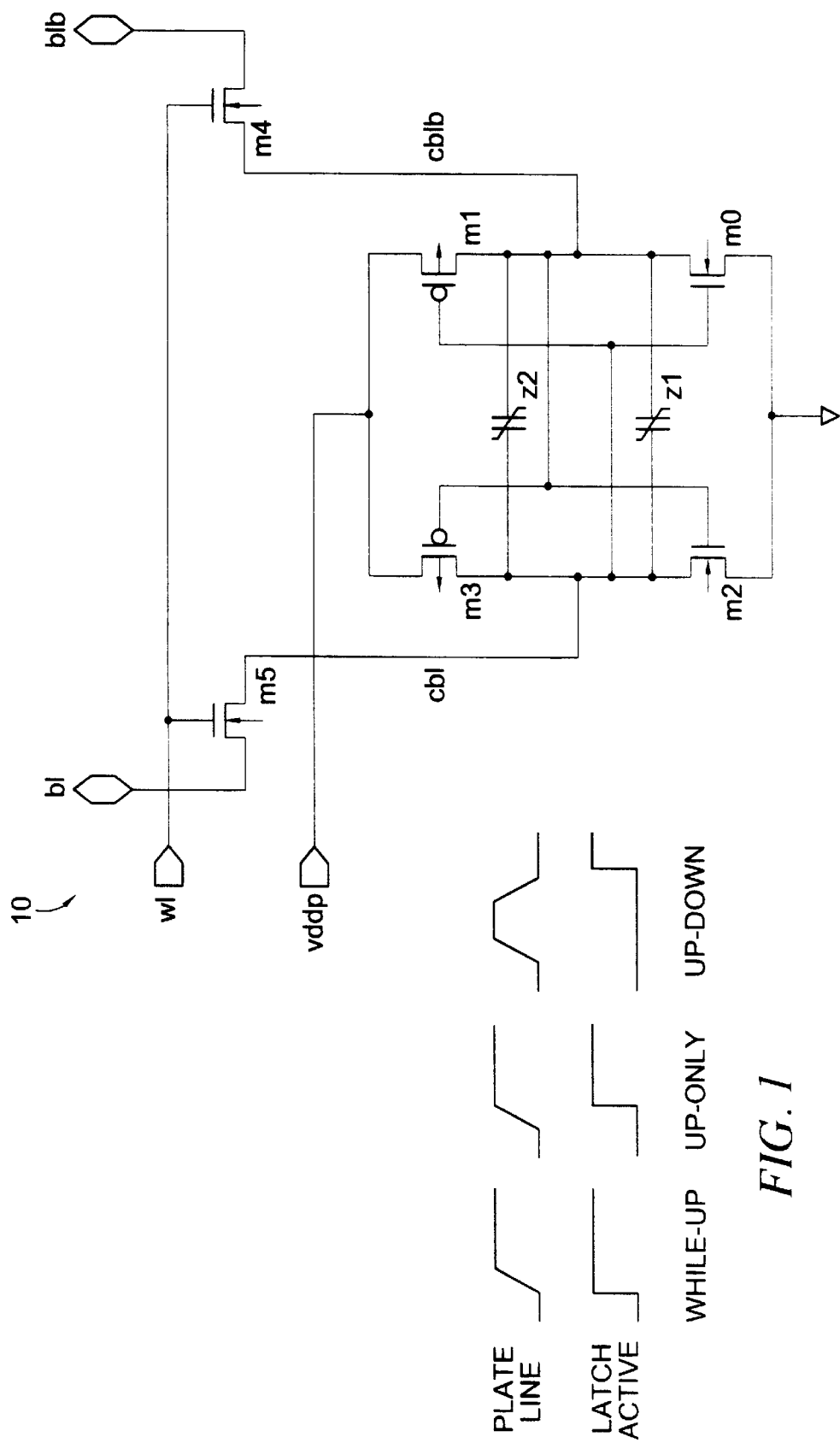
FIG. 1 is a series of three timing diagrams illustrating "while-up", "up-only" and "uidown" sensing methods.
FIG. 2 is a schematic diagram of a ferroelectric non-volatile latch circuit according to a first embodiment of the present invention.

Referring now to FIG. 2, a first embodiment 10 of a ferroelectric non-volatile latch according to the present invention is shown. The schematic diagram of FIG. 2 shows latch circuit 10 at the transistor and ferroelectric capacitor level. Latch circuit 10 includes a cross-coupled sense amplifier including P-channel transistors M1 and M3, and N-channel transistors M0 and M2. Power is provided at controlled node VDDP and a ground connection is established at the source/drains of transistors M0 and M2. The outputs of the sense amplifier portion of latch circuit 10 are at cell bit-line nodes CBL and CBLB. First and second ferroelectric capacitors Z1 and Z2 are tied between the cell bit-lines CBL and CBLB. Two N-channel pass transistors M5 and M4 are provided for access to the cell by connecting nodes CBL and CBLB to bit-line nodes BL and BLB, respectively. The gates of transistors M4 and M5 are coupled to word-line WL.

Figure 16:
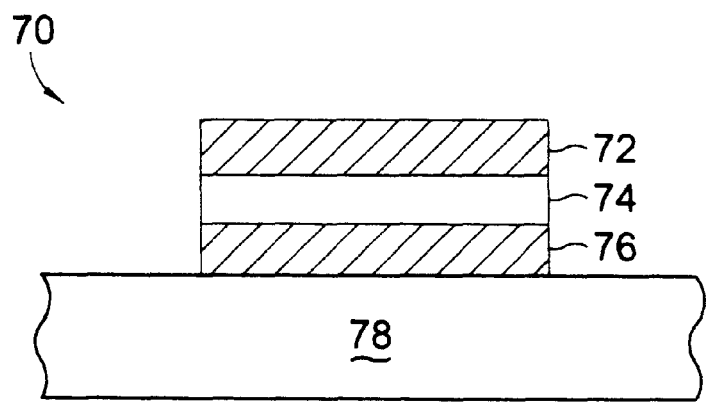
FIG. 16 is a cross-sectional diagram of an integrated circuit ferroelectric capacitor.

In operation, latch circuit 10 relies on the fact that it is easier for ferroelectric capacitors Z1 and Z2 not to switch than it is for them to switch. In other words for the same voltage, a switching capacitor requires more charge than a non-switching capacitor. The high-gain positive feedback of the sense amplifier ensures that the eventual values of the cell bit-lines CBL and CBLB are full-rail complementary states. It is important that the two ferroelectric capacitors Z1 and Z2 should be used to enable a balanced cell layout, otherwise latch circuit 10 may have an undesirable bias or loss of sensitivity. Each of ferroelectric capacitors Z1 and Z2 includes a top electrode and a bottom electrode, and it is important that each node CBL and CLBL have both a top electrode and a bottom electrode connection to each of the capacitors. (A typical integrated circuit ferroelectric capacitor 70 is shown in the cross-sectional diagram of FIG. 16, including a platinum or other suitable material top electrode 72, a PZT or other suitable ferroelectric dielectric layer 74, a platinum or other suitable material bottom electrode 76, and a silicon or other suitable substrate 78.) As an example, the top electrode of ferroelectric capacitor Z1 should be tied to node CBL, whereas the bottom electrode of ferroelectric capacitor Z1 should be tied to node CBLB. Correspondingly, the top electrode of ferroelectric capacitor Z2 should be tied to node CBLB, whereas the bottom electrode of ferroelectric capacitor Z2 should be tied to node CBL. This example can of course be reversed if desired.

Figure 3:
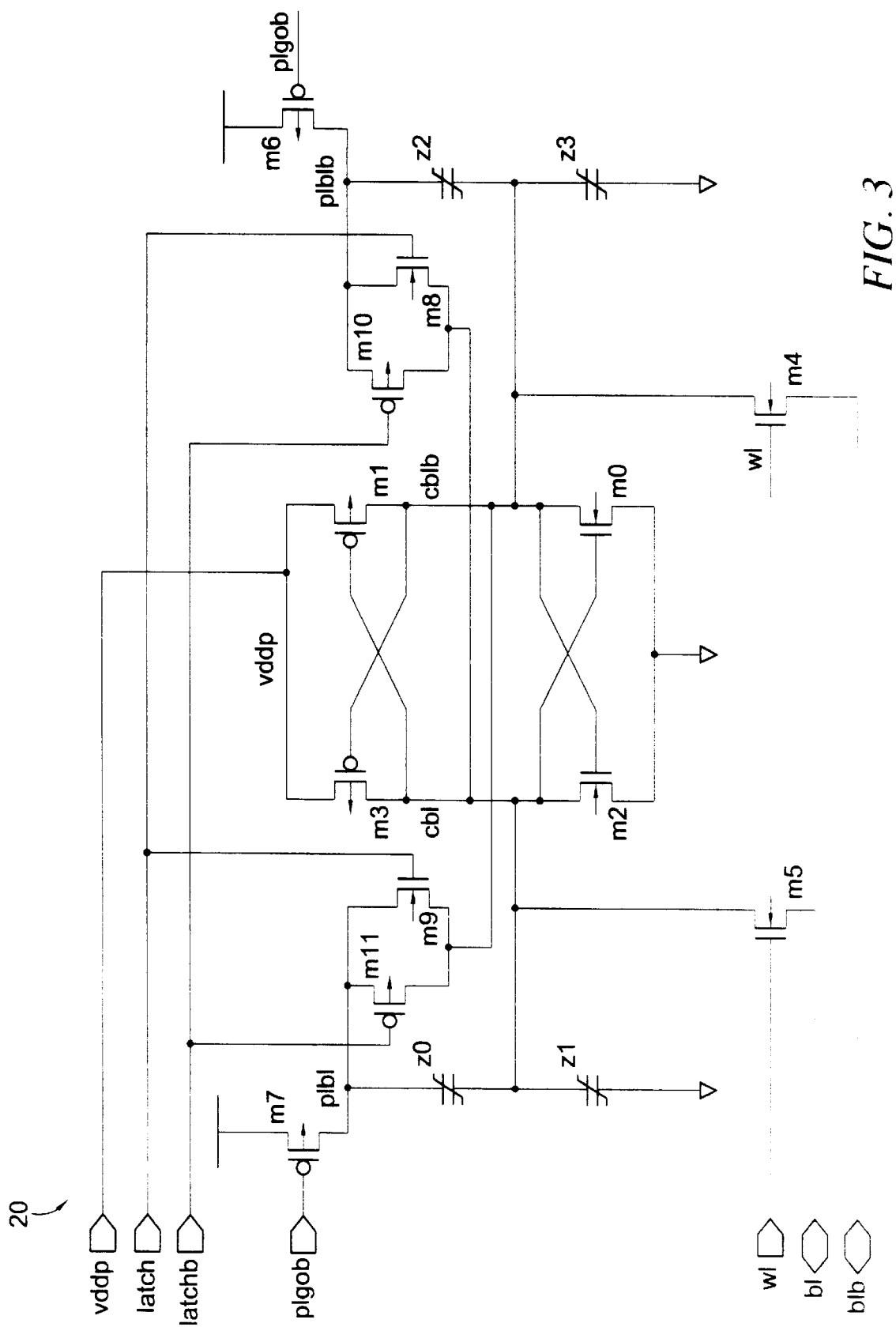
FIG. 3 is a schematic diagram of a ferroelectric non-volatile latch circuit according to a second embodiment of the present invention.

Referring now to FIG. 3, a second embodiment 20 of a ferroelectric non-volatile latch according to the present invention is shown. The schematic diagram of FIG. 3 shows latch circuit 20 at the transistor and ferroelectric capacitor level.

Latch circuit 20 includes a cross-coupled sense amplifier including P-channel transistors M1 and M3, and N-channel transistors M2 and M0, and cell bit-lines CBL and CBLB as shown. The sense amplifier is powered between a controlled VDDP power signal and ground. A first full transmission gate includes P-channel transistor M11 and N-channel transistor M9, which respectively receive control signals LATCHB and LATCH. The first transmission gate is used to couple nodes CBLB and PLBL as is further described below. A second full transmission gate includes P-channel transistor M10 and N-channel transistor M8, which also respectively receive control signals LATCHB and LATCH. The second transmission gate is used to coupled nodes CBL and PLBLB as is further described below. Two ferroelectric capacitors Z0 (storage capacitor) and Z1 (load capacitor) are serially coupled between node PLBL and ground, the center node being connected to node CBL. Two additional ferroelectric capacitors Z2 (storage capacitor) and Z3 (load capacitor) are serially coupled between node PLBLB and ground, the center node being connected to node CBLB. The gates of P-channel transistors M6 and M7 both receive a PLGOB control signal and the source/drains are respectively coupled between nodes PLBLB and PLBL and a source of power supply voltage. Finally, N-channel transistors M4 and M5 couple cell bit-lines CBLB and CBL to bit-line nodes BLB and BL, respectively, the gates being driven by the word-line WL control signal.

Latch circuit 20 uses staggered events to complete plate-line pulsing, data latching, and data rewrite. Up-only sensing is employed. Full transmission gates M9, M11 and M8, M10 are used to return the data on the CBL/CBLB nodes to the plate-lines at nodes PLBLB/PLBL, respectively. Thus, the complement of CBL is placed PLBL. Ferroelectric load capacitors Z1 and Z3 provide an increased load/storage capacitance ratio over equivalent-sized MOS capacitors. Pass gate transistors M4 and M5 transfer data to and from the outside world.

In operation, when the chip power supply reaches a sufficiently high voltage, a detect circuit (not shown) causes the PLGOB signal to fall, which pulses the individual plate-lines at nodes PLBL and PLBLB. With a sufficiently large load/storage capacitance ratio, most of the applied plate-line voltage is dropped across the ferroelectric storage capacitors Z0 and Z2. The first cell bit-line to reach a threshold voltage Vtn pulls down the opposite cell bit-line. At this time, the voltage across the ferroelectric storage capacitors Z0 and Z2 should be greater than the coercive voltage if the proper load/storage capacitor ratio is used, and the initial cell bit-line voltages are different based on the previously written state. The sense amplifier transistors, M2 and M0, can be made longer than the minimum length in order to allow for greater inherent signal separation prior to pulldown separation. The sense amplifier power supply signal, VDDP, is then brought high to internally latch the sensed state. If pulldown separation has not yet occurred, the rise of the VDDP signal causes P-channel amplification, which results in full rail signal separation. Control signal PLGOB is returned high to float the plate-lines PLBL and PLBLB. Once the correct data state is fully amplified, the transmission gates are activated via LATCH and LATCHB for rewrite.

Simulation of sensing shows the expected slope (voltage vs. time) differences between cell bit-lines CBL and CBLB when the PLBL and PLBLB nodes are pulsed. The simulation also shows that the pulldown separation does not occur until the CBL node approaches one volt, as expected from the longer length devices M0 and M2.

Figure 4:
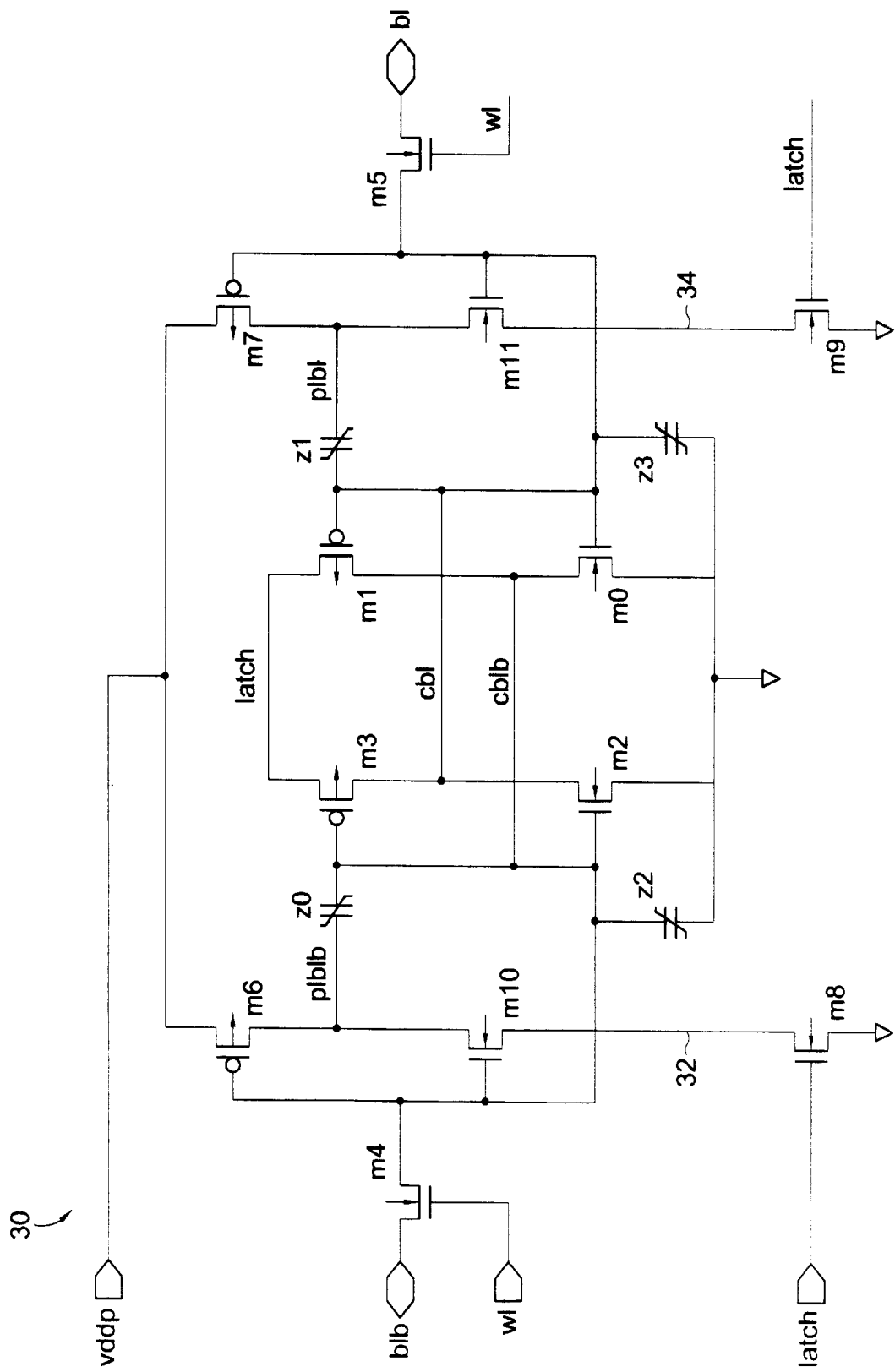
FIG. 4 is a schematic diagram of a ferroelectric non-volatile latch circuit according to a third embodiment of the present invention.

Referring now to FIG. 4, a third embodiment 30 of a ferroelectric non-volatile latch according to the present invention is shown. The schematic diagram of FIG. 4 shows latch circuit 30 at the transistor and ferroelectric capacitor level. The design of latch circuit 30 uses two control signals LATCH and VDDP to complete cell sensing. Unlike previous latch circuit 20, P-channel transistors M6 and M7 that provide plate-line pulsing are also used for data restoration. Again, N-channel pass transistors M4 and M5 are used to pass data to and from the external bit-lines BLB and BL.

Latch circuit 30 includes a sense amplifier including P-channel transistors M1 and M3 and N-channel transistors M0 and M2. Note that the sense amplifier is coupled between the LATCH node and ground. Ferroelectric storage capacitor Z0 is coupled between cell bit-line node CBLB and plate-line node PLBLB. Ferroelectric storage capacitor Z1 is coupled between cell bit-line node CBL and plate-line node PLBL. Ferroelectric load capacitor Z2 is coupled between the CBLB node and ground, and ferroelectric capacitor Z3 is coupled between the CBL node and ground. P-channel transistor M6, N-channel transistor M10, and N-channel transistor M8 are serially coupled between the VDDP node and ground, the coupled source/drains of transistors M6 and M10 being coupled to ferroelectric capacitor Z0 at node PLBLB, and the coupled gates of transistors M6 and M10 being coupled to a source/drain of transistor M4 at node CBLB. P-channel transistor M7, N-channel transistor M11, and N-channel transistor M9 are serially coupled between the VDDP node and ground, the coupled source/drains of transistors M7 and M11 being coupled to ferroelectric capacitor Z1 at node PLBL, and the coupled gates of transistors M7 and M11 being coupled to a source/drain of transistor M5 at node CBL. The gates of transistors M8 and M9 are controlled by the LATCH control signal.

In operation, when the chip power supply reaches a sufficiently high voltage, a power detect circuit (not shown) causes the VDDP signal to rise. Assuming the cell bit-lines CBL and CBLB began at ground level, the P-channel devices, M6 and M7, are both on, thereby charging up the plate-lines PLBL and PLBLB. With a sufficiently large load/storage capacitor ratio, most of the applied plate-line voltage is dropped across the storage capacitors Z0 and Z1. With the cell bit-line voltages CBL and CBLB remaining relatively low, P-channel devices M6 and M7 stay on and charge the plate-lines to a full VDDP voltage. The first cell bit-line to reach a threshold voltage Vtn pulls down the opposite cell bit-line. The sense amplifier N-channel transistors, M2 and M0, can be made longer than the minimum length in order to allow for greater inherent signal separation prior to pulldown separation. The LATCH signal is then brought high to internally latch the sensed state. If pulldown separation has not yet occurred, the rise of the LATCH signal causes P-channel amplification as previously discussed. The LATCH signal also activates the low side of the plate-line restore inverters (M6, M10; M7, M11) at nodes 32 and 34. As the cell bit-lines approach the rails, the plate-lines PLBL and PLBLB reach the full complementary state.

Figure 5:
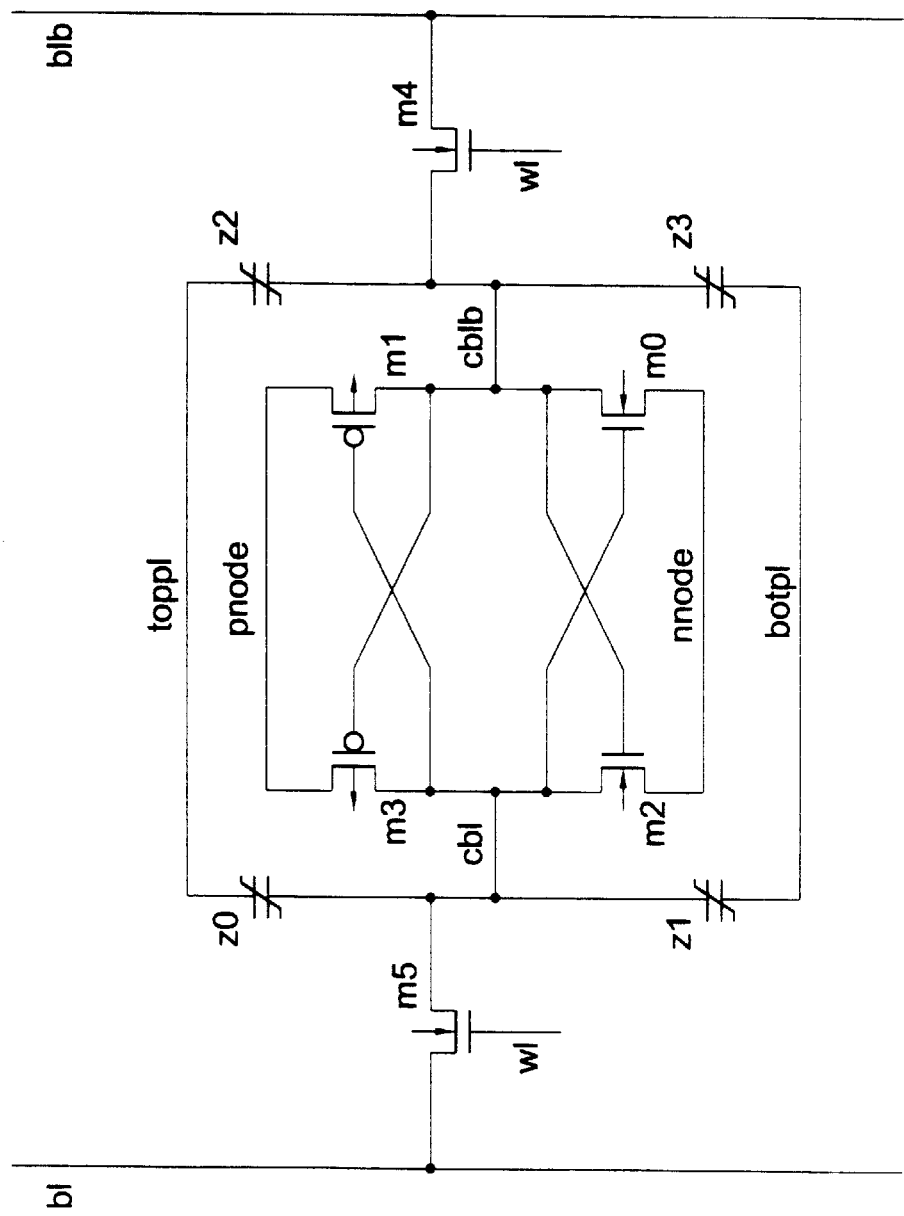
FIG. 5 is a schematic diagram of a ferroelectric non-volatile latch circuit according to a fourth embodiment of the present invention.

Referring now to FIG. 5, a fourth embodiment 40 of a ferroelectric non-volatile latch according to the present invention is shown. The schematic diagram of FIG. 5 shows latch circuit 40 at the transistor and ferroelectric capacitor level. Latch circuit 40 includes a cross-coupled sense amplifier portion including P-channel transistors M1 and M3, and N-channel transistors M0 and M2. The source/drains of transistors M2 and M3 are coupled together at the cell bit-line CBL and the source/drains of transistors M0 and M1 are coupled together at the complementary cell bit-line CBLB. The sense amplifier is powered through control signals PNODE and NNODE. A first ferroelectric capacitor Z0 (storage capacitor) is coupled between the TOPPL node and the CBL node. A second ferroelectric capacitor Z1 (load capacitor) is coupled between the CBL node and the BOTPL node. A third ferroelectric capacitor Z2 (storage capacitor) is coupled between the TOPPL node and the CBLB node. A fourth ferroelectric capacitor Z3 (load capacitor) is coupled between the CBLB node and the BOTPL node. N-channel transistor M4 couples the complementary cell bit-line CBLB to the complementary bit-line BLB. N-channel transistor M5 couples the cell bit-line CBL to the bit-line BL. The gates of transistors M4 and M5 are controlled by the word-line WL signal.

Figure 6:
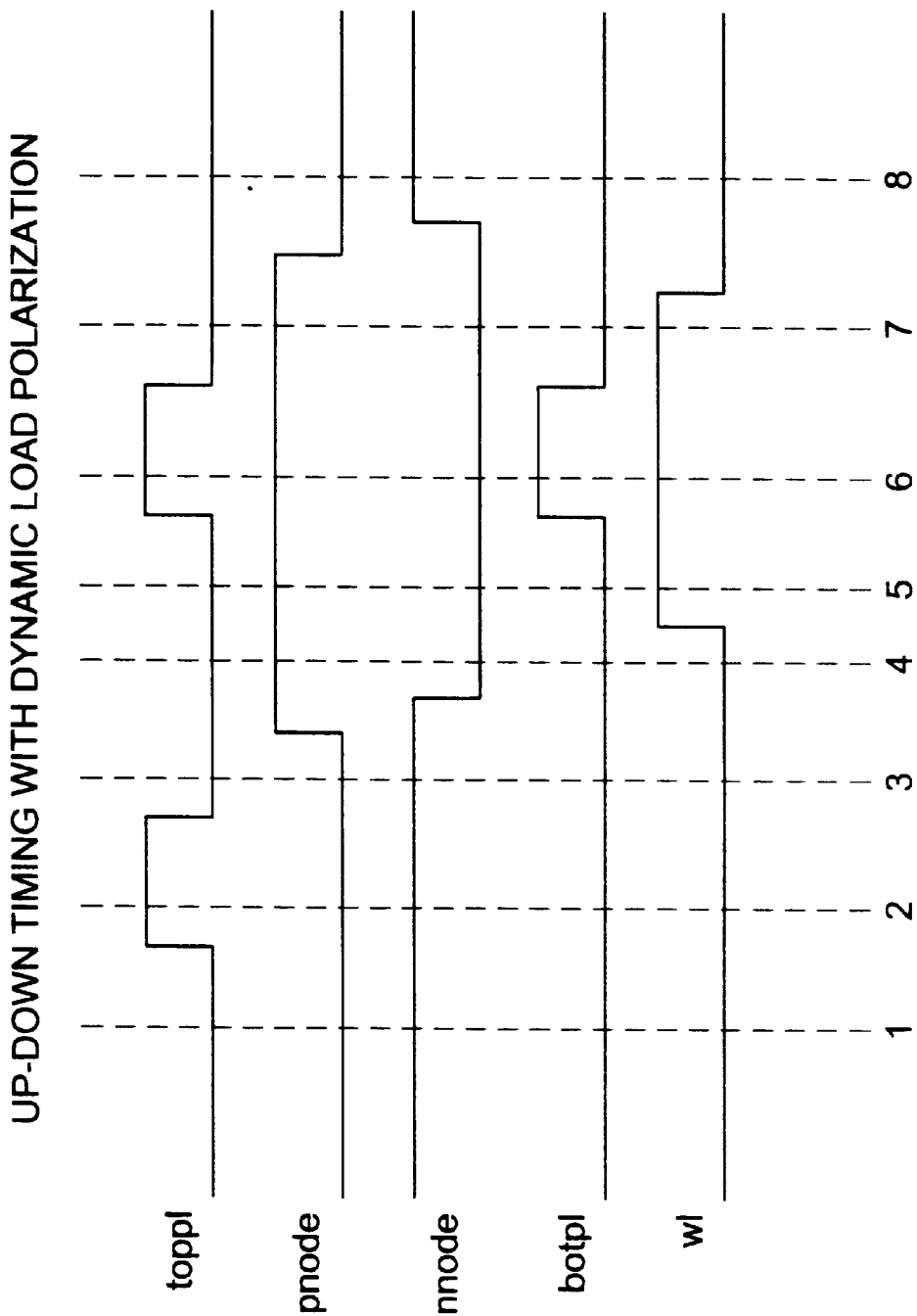
FIG. 6 is a timing diagram associated with the latch circuit of FIG. 5, illustrating up-down timing with dynamic load polarization.
Figure 7:
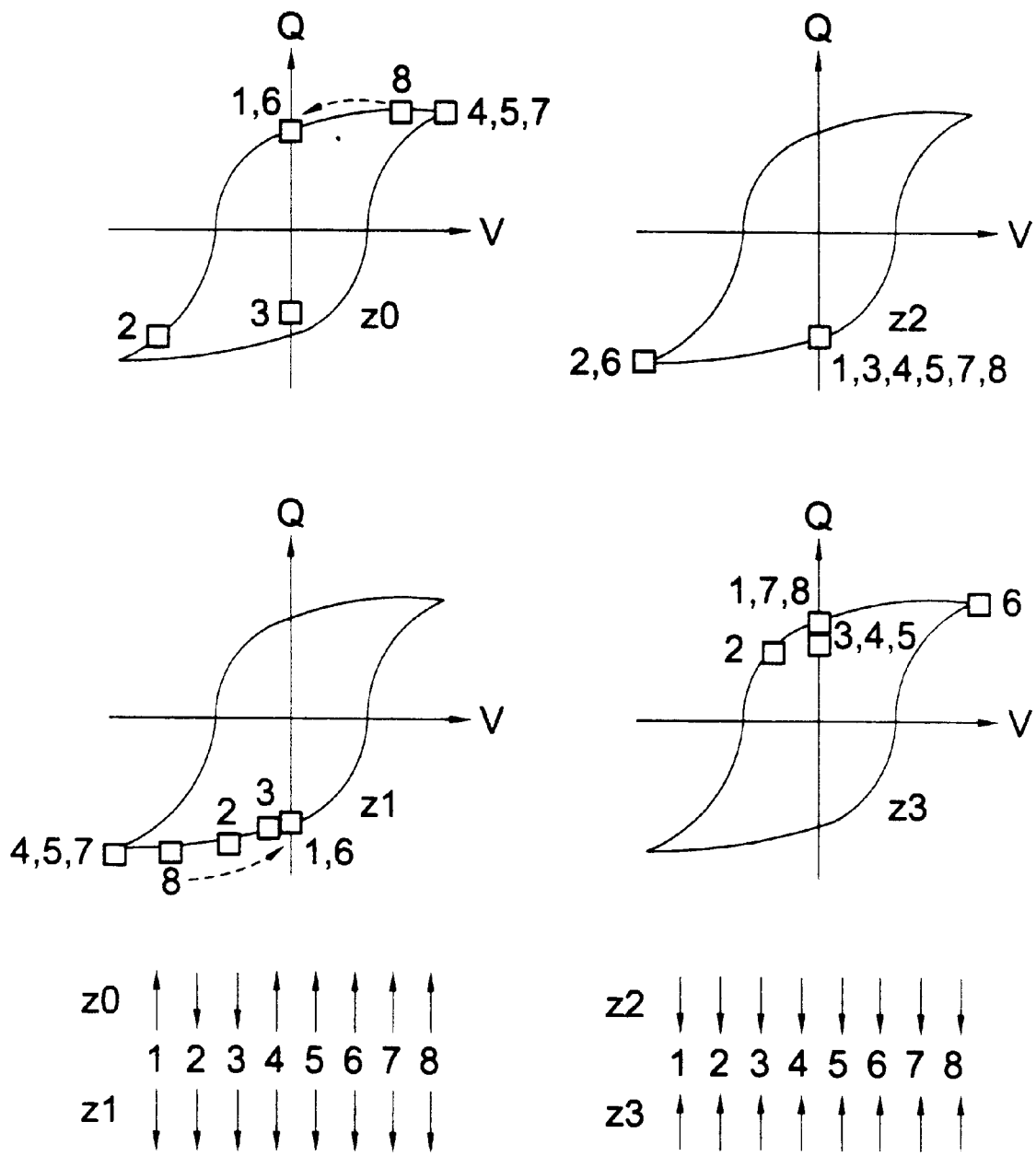
FIG. 7 is a series of hysteresis loops and polarity versus time charts associated with each of the ferroelectric capacitors in the latch circuit of FIG. 5.

The operation of latch circuit 40 in the up-down operational mode with a dynamic load is best understood with reference to FIGS. 6 and 7. FIG. 6 is a timing diagram associated with the latch circuit 40, illustrating up-down timing with dynamic load polarization; and FIG. 7 is a series of hysteresis loops and polarity versus time charts associated with each of the ferroelectric capacitors Z0, Z1, Z2 and Z3 in the latch circuit 40.

Referring now to FIGS. 6 and 7, prior to time t1, a logic one has been programmed into latch circuit 40 at node CBL. After the write operation, the Z2 and Z1 polarization vectors point down, while the Z0 and Z3 polarization vectors point up. Polarization vectors are taken with respect to the Q-axis of the hysteresis loops shown in FIG. 7. The Z0 polarization vector points up, meaning that when TOPPL is pulsed, the capacitor will switch. The Z2 capacitor, on the other hand, will not switch when TOPPL is pulsed.

At time t2, sensing begins by pulsing TOPPL. The load/storage capacitor area ratio, combined with the initial polarization vectors determines the voltage drop across each capacitor. Ferroelectric capacitors Z2 and Z0 are the storage capacitors, while ferroelectric capacitors Z3 and Z1 are the load capacitors. Since capacitors Z0 and Z1 were initially polarized in opposite directions, and capacitor Z0 is switching, capacitor Z1 will not switch and provides a linear capacitive load. On the other side, capacitor Z2 is not switching and capacitor Z3 is switching. Capacitor Z3 provides a larger capacitive load than capacitor Z1. This difference between the behavior of the load capacitors Z3 and Z1 is referred to as dynamic loading. The impact of the dynamic load difference between capacitors Z3 and Z1 is dependent upon the shape of the hysteresis curve in the region traversed during the plate pulsing.

At time t3, up-down pulsing is completed by returning TOPPL to ground. The capacitors return to their new unbiased polarization states.

At time t4, PNODE and NNODE are used to activate the latch and the stored state is sensed and amplified. During this time, TOPPL and BOTPL are held low and ferroelectric capacitors Z0 and Z1 are restored to their original polarization.

At time t5, the word-line, WL, is activated to pass the sensed data out of the cell.

At time t6, with the latch circuit 40 still active, both TOPPL and BOTPL are pulsed high, which restores ferroelectric capacitors Z2 and Z3 to their original polarization.

At time t7, control signals TOPPL and BOTPL are both returned to ground level.

At time t8, the word-line WL is turned off and the latch circuit 40 is deactivated at the end of the cycle. The latch circuit 40 could remain active when power is applied, in which case the cell would behave much like an SRAM cell during normal operation.

In conclusion, dynamic load polarization is accomplished by pulsing the bottom plate-line while the latch is active. This places the load capacitors (Z1, Z3) in the opposite polarization state as the storage capacitors (Z0, Z2) and helps to increase the initial voltage differential between CBL and CBLB prior to amplification.

Figure 8:
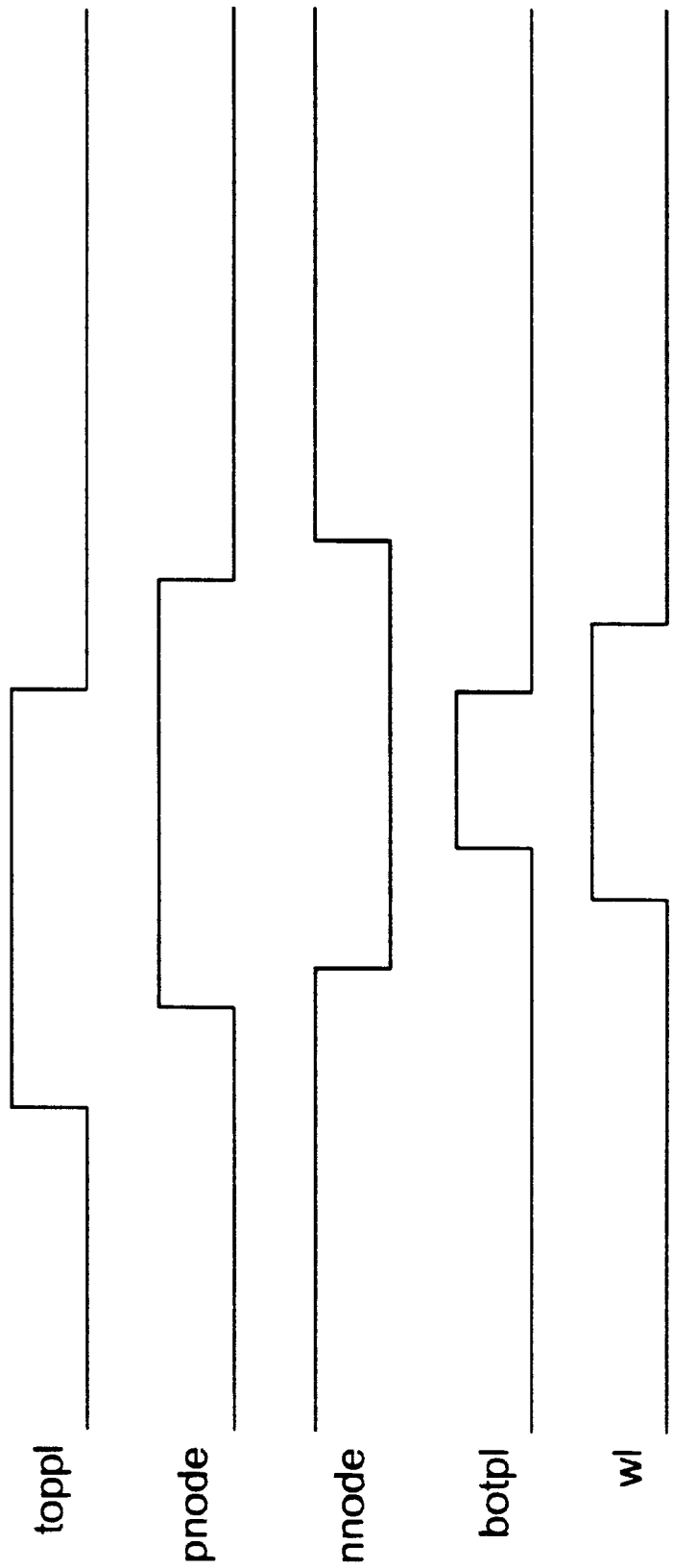
FIG. 8 is a timing diagram associated with the latch circuit of FIG. 5, illustrating up-only timing with dynamic load polarization.

The timing diagram of FIG. 8 shows up-only timing with dynamic load polarization for latch circuit 40. In the up-only scheme, latch circuit 40 is activated when TOPPL is still high. This reduces the time to data availability (TOPPL to WL). However, time must still be allowed between the time the TOPPL signal goes low to the time latch circuit 40 is deactivated in order to ensure sufficient restoration of the storage capacitor on the logic one side.

Figure 9:
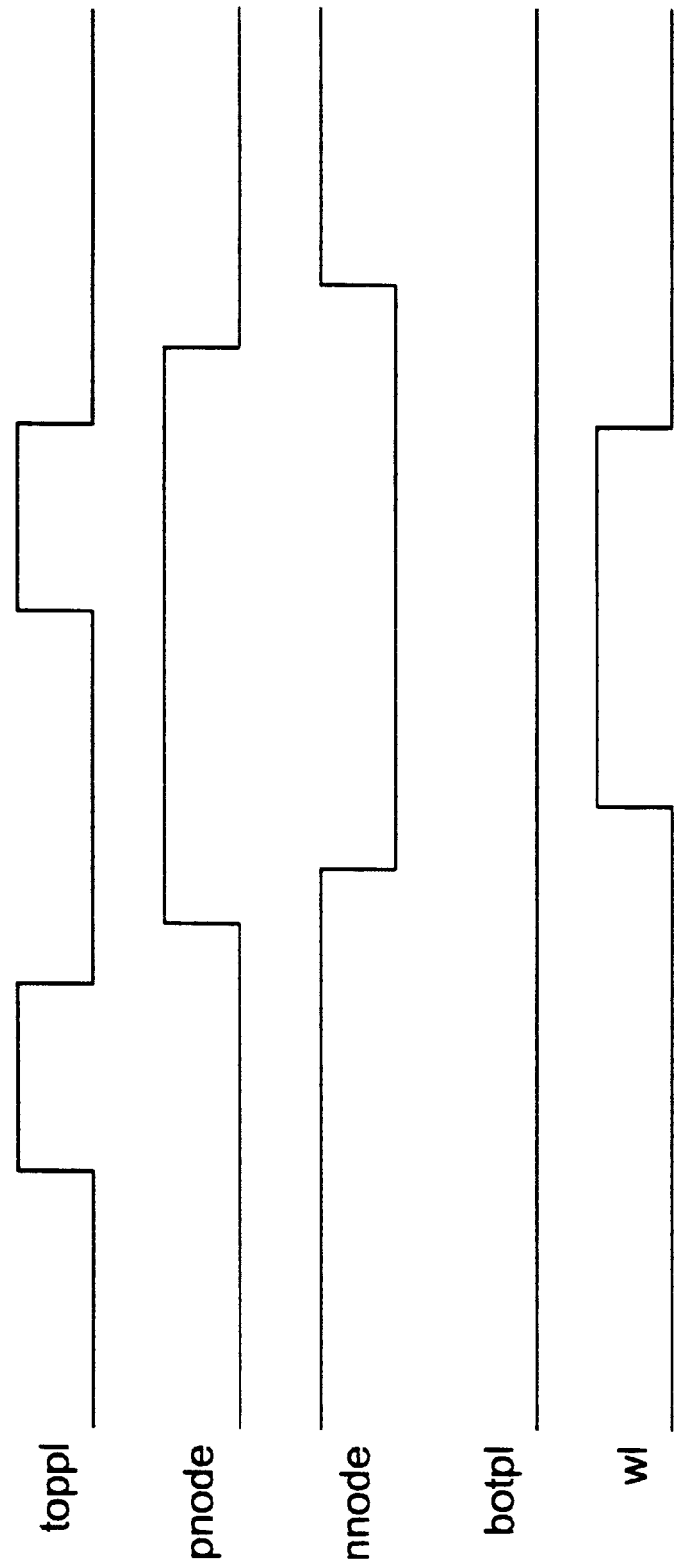
FIG. 9 is a timing diagram associated with the latch circuit of FIG. 5, illustrating up-down timing with a static ferroelectric load.
Figure 10:
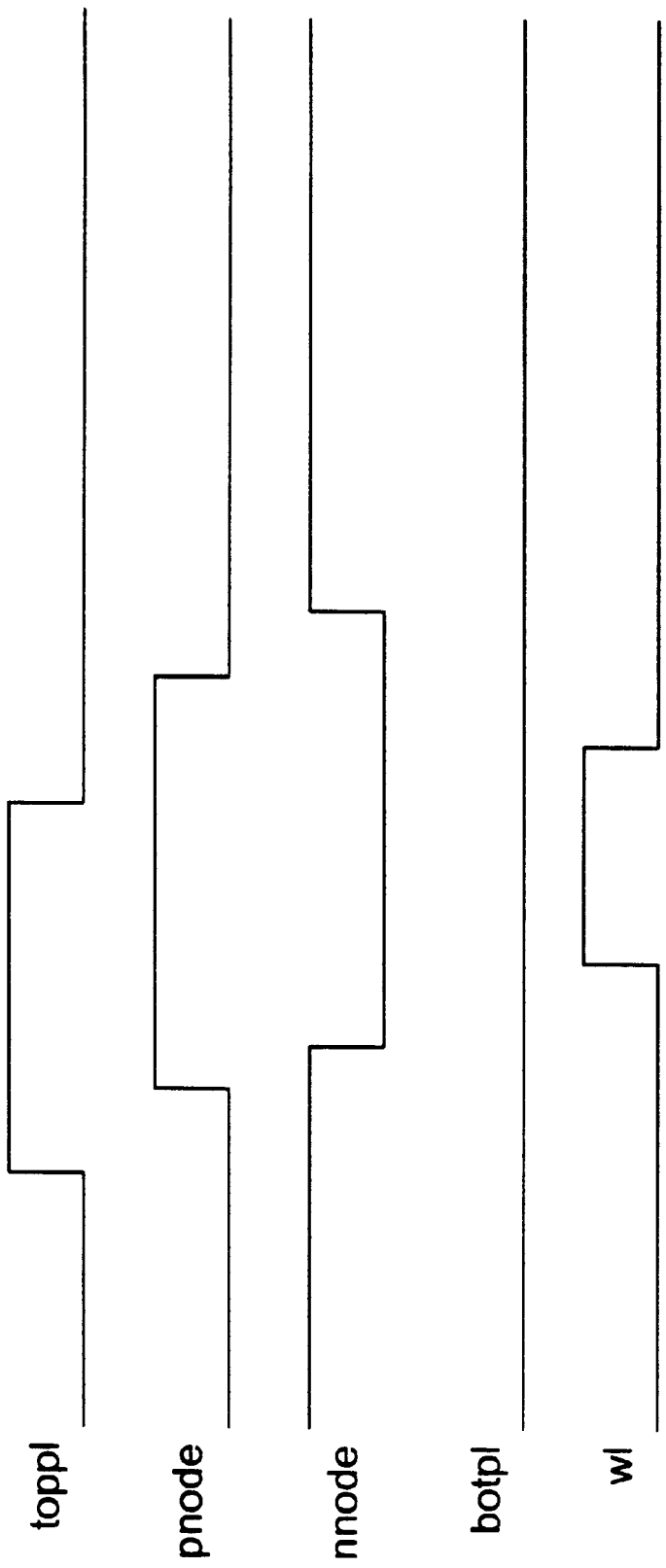
FIG. 10 is a timing diagram associated with the latch circuit of FIG. 5, illustrating up-only timing with a static ferroelectric load.

Latch circuit 40 can also be operated with a static load. This is done by simply holding the BOTPL signal at ground level throughout operation. Once both states have been written into latch circuit 40 (as in product testing), both the load capacitors will polarized in the same direction and provide the same load capacitance. In this case, the storage capacitor polarization differential alone is used to determine the stored state. The following two timing diagrams show static load operation for both the up-down (FIG. 9) and up-only case (FIG. 10).

Figure 11:
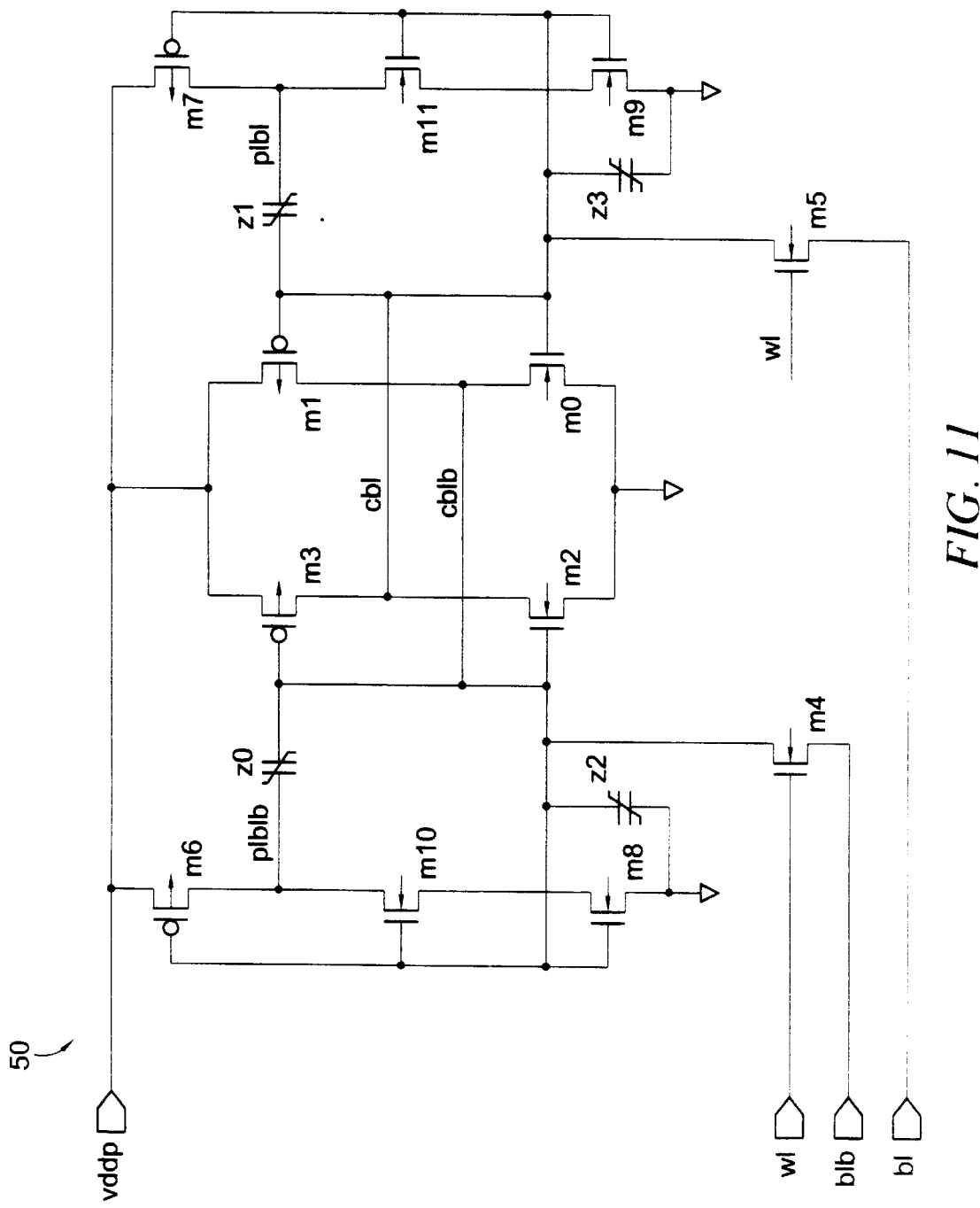
FIG. 11 is a schematic diagram of a ferroelectric non-volatile latch circuit according to a fifth embodiment of the present invention.

Referring now to FIG. 11, a fifth embodiment 50 of a ferroelectric non-volatile latch according to the present invention is shown. The schematic diagram of FIG. 11 shows latch circuit 50 at the transistor and ferroelectric capacitor level. Latch circuit 50 is based on the design of latch circuit 30 shown in FIG. 4. The design of latch circuit 50, however, only uses one control signal VDDP for sensing. This is accomplished by combining the VDDP and LATCH signals into one signal (VDDP) and resizing devices to prefer a certain order of events. Again, N-channel pass transistors M4 and M5 are used to pass data to and from the external bit-lines BL and BLB.

In operation, when the chip power supply reaches a sufficiently high voltage, a detect circuit (not shown) causes the VDDP signal to rise. Assuming the cell bit-lines began at ground level, the P-channel devices, M6 and M7, will both be on, thereby charging up the plate-lines. With a sufficiently large load/storage capacitance ratio, most of the applied plate-line voltage will be dropped across the storage capacitors Z0 and Z1. With the cell bit-line voltages remaining relatively low, the P-channel devices will stay on and charge the plate-lines to near VDD. As the VDDP signal rises and the cell bit-lines stay low, the P-channel sensing transistors, M1 and M3, will begin to assist with bit-line amplification. The lower the load/storage capacitance ratio, the longer the delay before P-channel amplification; however, the lower the load/storage capacitance ratio, the lower the voltage across the storage capacitor. The optimum load/storage capacitance ratio is obviously a trade-off. The sensing P-channel devices M1 and M3 can be given a long channel to increase the threshold voltage and thus increase the voltage applied to the storage capacitors prior to sensing.

The first cell bit-line (CBL or CBLB) to reach a Vtn (threshold voltage of transistor M0 or M2) will pull down the opposite cell bit-line. Also, the first cell bit-line to reach the longer channel Vtn of transistor M8 or M9 will turn on the plate-line pulldown devices. These N-channel devices, M8 and M9, can be longer than the sensing transistors so that plate-line pulldown will not occur until sensing pulldown has first separated the signal (CBL, CBLB). Pulsing, sensing, and restoration are nearly simultaneous.

Figure 12:
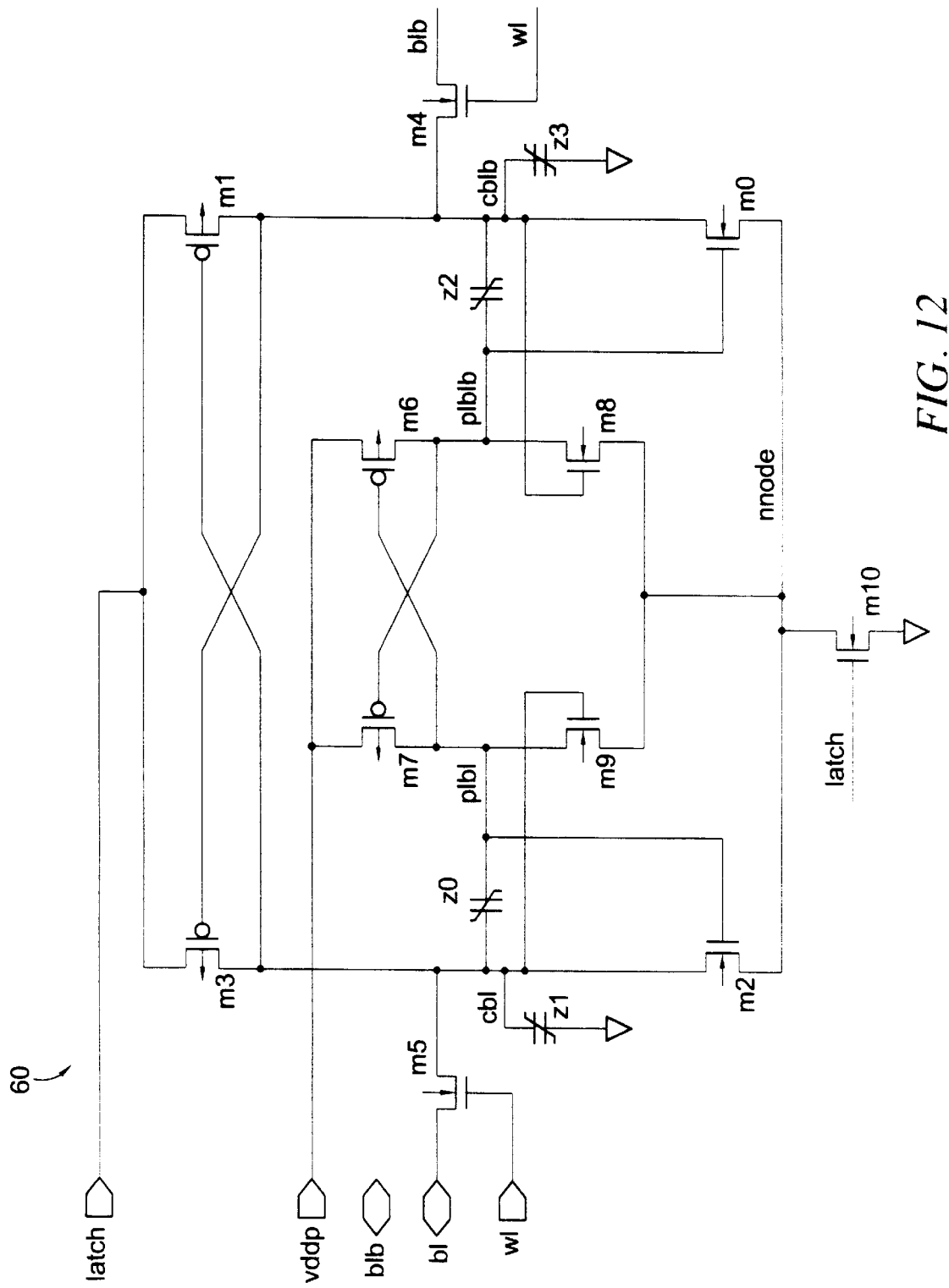
FIG. 12 is a schematic diagram of a ferroelectric non-volatile latch circuit according to a sixth embodiment of the present invention.

Referring now to FIG. 12, a sixth embodiment 60 of a ferroelectric non-volatile latch according to the present invention is shown. The schematic diagram of FIG. 12 shows latch circuit 60 at the transistor and ferroelectric capacitor level. Latch circuit 60 can be thought of as a pair of cross-coupled sense-amplifiers. The P-channel transistors M6, M7 and M1, M3 are internally cross-coupled in the normal fashion, while the gates of the N-channel transistors M8, M9 and MD, M2 are tied to the opposite sense amplifier. The design is unique in that plate-line sensing is used, rather than bit-line sensing.

Latch circuit 60 includes a first sense amplifier including cross-coupled P-channel transistors M1 and M3, and N-channel transistors M0 and M2. A second sense amplifier includes cross-coupled P-channel transistors M6 and M7 and N-channel transistors M8 and M9. The first sense amplifier is coupled between the LATCH and NNODE nodes, and the second sense amplifier is coupled between the VDDP and NNODE nodes. The coupled source/drains of transistors M2 and M3 form the cell bit-line CBL, and the coupled source/drains of transistors M0 and M1 form the complementary cell bit-line CBLB. The coupled source/drains of transistors M7 and M9 form the plate-line PLBL node, and the coupled source/drains of transistors M6 and M8 form the complementary plate-line PLBLB node. The gate of transistor M2 is coupled to the PLBL node, the gate of transistor M9 is coupled to the CBL node, the gate of transistor M8 is coupled to the CBLB node, and the gate of transistor M0 is coupled to the PLBLB node.

A ferroelectric storage capacitor Z0 is coupled between the CBL and PLBL nodes, a ferroelectric load capacitor Z1 is coupled between the CBL node and ground, a ferroelectric storage capacitor Z2 is coupled between the CBLB and PLBLB nodes, and a ferroelectric load capacitor Z3 is coupled between the CBLB node and ground.

N-channel transistors M5 and M4 couple the cell bit-line nodes CBL and CBLB to the bit-line nodes BL and BLB. The gates of transistors M4 and M5 are controlled by the WL word-line.

In operation, at time zero, all nodes are at ground level. When sufficient power is applied to the chip, a detection circuit (not shown) initiates the rise of the VDDP signal. The plate-lines PLBL and PLBLB begin to rise via conduction through the internal sense-amplifier P-channel transistors, M6 and M7. The ferroelectric polarization differential (from the stored state) results in one of the storage capacitors (Z0 or Z2) switching. The polarization of the load capacitors (Z1 and Z3) will always be reinforced. The load capacitors Z1 and Z3 are larger than the storage capacitors Z0 and Z2 in order to establish sufficient voltage across the storage capacitors to reach the coercive voltage.

The side of latch circuit 60 with the switching storage capacitor will exhibit a larger series capacitance. This larger capacitance will cause the associated plate-line to charge more slowly than the non-switching side. For the rest of this analysis, it is assumed that a logic zero state was previously written into latch circuit 60. In this case, ferroelectric capacitor Z2 will be the only switching ferroelectric capacitor. The node PLBLB exhibits a larger capacitance to ground and will charge more slowly than PLBL node. As PLBL rises faster, it inhibits the charging of PLBLB, thereby providing positive feedback. Any voltage on PLBLB will act to slow down the rise of PLBL. This negative feedback, however, is compensated by the positive feedback. While both nodes PLBL and PLBLB change slope due to their interaction, simulation shows that the positive feedback continues to separate the voltage at the plate-lines, even after the slope of PLBL is affected by the negative feedback.

As PLBL and PLBLB rise, both transistors M0 and M2 will turn on. Any charge on CBLB will be conducted onto NNODE through transistor M0. If the voltage at NNODE then exceeds the voltage at CBL, current through M2 will charge up CBL. This equalization of the cell bit-lines at first appears to be detrimental negative feedback. However, this design relies on plate-line sensing. While the cell bit-line equalization does not help plate-line sensing, it does not hurt plate-line sensing, either. Additionally, the rising of NNODE with CBL or CBLB has the benefit of inhibiting conduction of M8 and M9. The plate-lines are then free to separate via P-channel only amplification.

After time has been allowed for the plate-lines to separate, the LATCH signal rises. This event simultaneously causes N-channel latching of both sense-amplifiers and P-channel latching of the outer (bit-line) sense-amplifier. As NNODE is pulled low through transistor M10, PLBL and PLBLB will both show a small dip due to the conduction through transistors M8 and M9. If CBL and CBLB had fully equalized, this dip will be common-mode (same current). If CBL and CBLB had not yet equalized, the dip will be positive feedback desirably further separating PLBL and PLBLB. Transistors M0 and M2 will conduct different currents based upon the differential plate-line voltage left after the rise of VDDP. Since PLBL was left higher than PLBLB, CBL will fall faster than CBLB.

As the LATCH signal continues to rise, transistors M1 and M3 will begin to charge up CBL and CBLB. Since CBL started out lower, CBLB will be charged up faster due to the positive feedback of cross-coupled transistors M1 and M3. The rise in CBLB will capacitively couple onto PLBLB through capacitor Z2. This coupling is negative feedback. This negative feedback only occurs, however, after the cell bit-lines are definitively separated. As CBLB continues to rise, transistor M8 begins to conduct, thereby restoring the positive feedback and pulling PLBLB to ground level.

Load Issues

Figure 13:
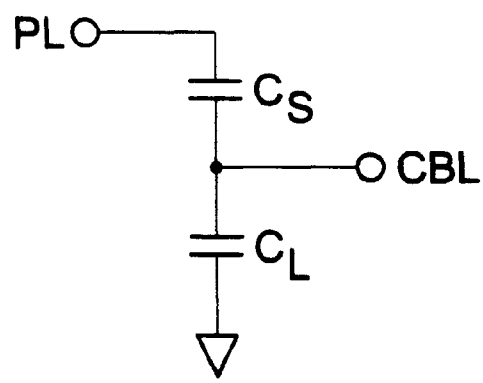
FIG. 13 is a schematic diagram of a capacitance divider circuit including a storage capacitor and a load capacitor.

In ferroelectric memories, an important relationship exists between the size of the ferroelectric storage capacitor and the magnitude of the load capacitance. Consider a simple capacitor divider circuit as shown in FIG. 13. In this simplified example, $C_S$ represents the storage capacitor value, $C_L$ represents the load capacitance value, PL represents the plate-line and CBL represents the cell bit-line. The voltage at CBL is given by the following equation:

$$V(cbl) = V(pl) \cdot \frac{1}{1 + \frac{C_L}{C_S}}$$

Figure 14:
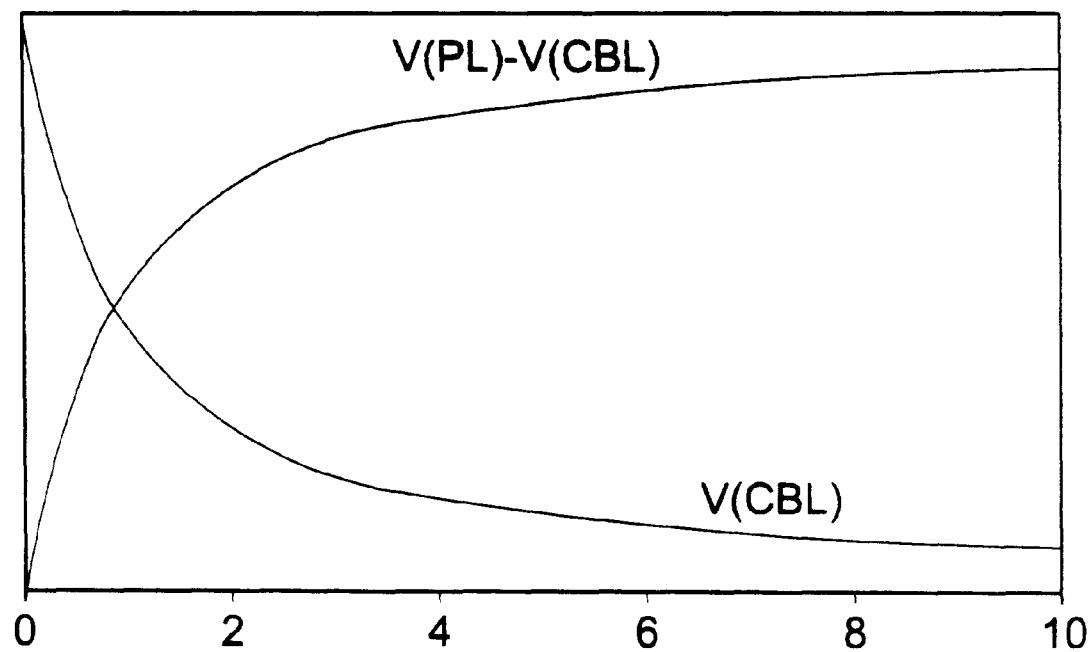
FIG. 14 is a plot of the voltages across the load and storage capacitors of FIG. 13 plotted as a function of the load/storage capacitance ratio.

The voltage across $C_L$ is simply V(CBL), and the voltage across $C_S$ is V(PL)-V(CBL). The voltages across $C_L$ and $C_S$ are plotted in FIG. 14 as a function of the ratio $C_L/C_S$.

For large $C_L$ to $C_S$ ratios, most of the voltage is dropped across $C_S$, and little signal is established on the bit-line, CBL. A smaller starting bit-line voltage results in a smaller voltage differential between complementary bit-lines, which makes the sensing circuitry more susceptible to small parametric imbalances. For small $C_L$ to $C_S$ ratios, most of the voltage is dropped across $C_L$, and little is dropped across $C_S$. In this case, the starting bit-line voltage will be larger. At this point, however, an important distinction between this simplified example and actual ferroelectric capacitor operation must be made.

Figure 15:
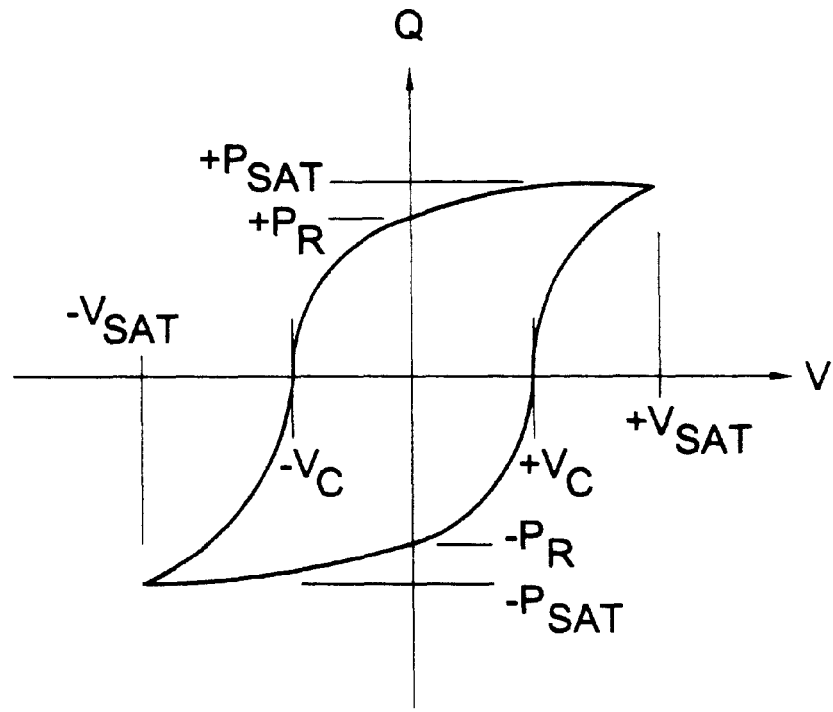
FIG. 15 is an annotated hysteresis loop illustrating the electrical characteristics of a ferroelectric capacitor.

The hysteresis loop of a ferroelectric capacitor is shown in FIG. 15. The hysteresis loop shows that for low voltages across the storage capacitor ($C_S$), little difference exists between the effective capacitance of a logic one state and a logic zero state. The effective capacitance is given by the slope of the Q-V curve at a given operating point, in this case V=0.

So, for small $C_L$ to $C_S$ ratios, where the operating point of the storage capacitor is well below the coercive voltage ($V_C$), the storage capacitor loses its ability to reliably distinguish between a logic one and a logic zero. Thus, for real ferroelectric materials, an optimal load to storage ratio exists where circuit reliability is maximized.

In ferroelectric memory arrays, the load/storage capacitance ratio is determined by the relationship between the parasitic bit-line capacitance and the switched charge of the memory cell capacitor. In previous ferroelectric non-volatile latches, the load capacitance is not considered. In the previous designs, the small size of a single latch suggests very small parasitic load capacitances. From the discussion above, it has been shown that small parasitic loads result in very low interrogation voltages, which reduce the reliability of the design. The design of latch circuits 20, 30, 40, 50, and 60 according to the present invention provide for larger load capacitances that increase interrogation voltages and thus improve reliability.

Load Capacitor Considerations (Latch Circuits 20–60)

A prominent feature of all ferroelectric non-volatile latch designs according to the present invention, with the exception of latch circuit 10, is the presence of a ferroelectric load capacitor. This load capacitor is used to increase the load/storage capacitor ratio and does not need to be a ferroelectric capacitor. Ferroelectric capacitors are used because of their high dielectric constant, which enables the desired load capacitance to be implemented in a smaller area. Increasing the load/storage capacitor area ratio causes more of the applied plate voltage to be dropped across the storage capacitor. In ferroelectric memory designs, it is important to apply a voltage to the capacitors that sufficiently exceeds the coercive voltage. This is due to the fact the existing ferroelectric materials have very similar switching and non-switching slopes below the coercive voltage. As the load capacitor area is increased, however, the starting voltage differential is decreased due to the fact that most of the applied voltage is now dropped across the storage capacitors and little is dropped across the load capacitors.

Load Capacitor Biasing (Latch Circuits 20–60)

Since ferroelectric reference capacitors are used, each latch must be written to both states before use to guarantee symmetrical sensing. A write to both states is not necessary, however, to guarantee correct sensing. Actually, greater signal margin should result when the latch circuit is only written once. Production testing, however, requires full functional testing, so symmetrical sensing is the most practical. Over time, the same-state signal margin should actually increase due to loop shift. Opposite-state performance can be expected to degrade if the latched voltages are applied to ferroelectric capacitors the whole time the chip is powered. Furthermore, the effect of time-dependent-dielectric-breakdown (TDDB) may be added to reliability concerns. Alternatively, the latch could be read only upon power-up, or when requested. This approach may be necessary for applications where long term opposite-state reliability is required, or if TDDB is shown to be a reliability problem.

Power-up Considerations (All Latch Circuits)

The power supply for these circuits, VDDP, should only rise after the chip power supply voltage $V_{DD}$ has reached a voltage high enough to guarantee a sufficient rewrite. Circuitry may also be included to detect when the power is being removed so that a controlled power down can be completed while the latch circuit is still in a known realm of operation.

Latch Circuit Power Supply Considerations:

In each of latch circuit designs 10, 30, 50, and 60, the VDDP signal could be directly tied to the chip power supply $V_{DD}$. In real systems, $V_{DD}$ often changes slowly due to relatively large decoupling and parasitic capacitance. In poorly designed systems, inductive loads can result in $V_{DD}$ undershoot or power up voltage ringing. As such, direct connection of VDDP to $V_{DD}$ results in system dependent operation and subjects the latch circuits to an expanded range of operating environments. To reduce latch circuit exposure to power supply transients and limit the dynamic range of power up timing, a controlled VDDP is preferred. In this preferred implementation, VDDP remains low until sufficient power has been applied to the chip $V_{DD}$ pin. Then, a specific sequence of control signals is used to interrogate the latch circuit.

Another reason exists for using a controlled supply level for latch circuits 10, 30, 50 and 60. While many potential latch circuit applications involve performing a write only once and reading that original state throughout the lifetime of the part, several practical uses for the non-volatile latch circuit require frequent data state changes. Existing ferroelectric materials may exhibit poor fatigue and opposite state retention characteristics when biased for extended periods of time. Therefore, in latch circuit applications involving frequent data state changes, it is desirable to limit the amount of time during which the ferroelectric capacitors are under bias. If the latch circuit supply was tied directly to $V_{DD}$, bias would be applied to the ferroelectric capacitors as long as $V_{DD}$ was applied to the chip. So, to limit the ferroelectric capacitor bias time, a controlled supply, VDDP is used.

Latch circuits 20 and 40 require specific control signal events to occur prior to activating the sense amplifier portion of the latch circuit. This can only be accomplished by using a controlled power supply signal, VDDP.

Testing Results

A test structure containing the ferroelectric non-volatile latch circuits except for latch circuit 40 has been fabricated. All latch circuits according to the present invention, however, have been thoroughly tested through the use of extensive computer simulations. Multiple versions of each of the five designs were included on test structures for a total of twenty test circuits. Versions of the basic design vary from one another in either storage capacitor size or load capacitor to storage capacitor area ratio. All latch circuits in several test structure sites have been tested as described below. Between each numbered step, the power supply is actively driven to ground.

The testing steps are performed as follows:

1. A READ is performed on the latch circuit to characterize its preferred state and polarize the storage capacitors;
2. A WRITE to the opposite state is performed;
3. A READ is performed to verify that the opposite state has been retained;
4. If the opposite state was retained, a WRITE to the original state is performed;
5. A READ is performed to verify that the original state has been retained;
6. If the original state was retained, a second WRITE to the opposite state is performed;
7. A READ is performed to verify that the opposite state has been retained;
8. The test structure is left unpowered for approximately 24 hours at room temperature; and
9. A READ is performed to verify the 24 hour retention of the opposite state.

The test results are summarized below:

Latch circuit 10—Two latch circuits passed testing through step 5 and one passed all testing steps;

Latch circuit 20—A majority of latch circuits passed all testing steps;

Latch circuit 30—A majority of latch circuits passed all testing steps;

Latch circuit 50—One latch circuit passed testing through step 5, but none passed all testing steps; and Latch circuit 60—A majority of latch circuits passed all testing steps.

The success of designs for latch circuits 20, 30 and 60 confirms the positive simulation results, which were conducted on all circuit designs. Designs for latch circuits 10 and 50 are inherently low margin designs, so the poor test results for these latch circuits are not completely unexpected. The partial success of some of latch circuits 10 and 50 confirms their functionality. Designs for latch circuits 10 and 50 may not be as robust as the other designs, but margin enhancing design techniques may improve performance. Such possible techniques include, but are not limited to, a reduction in sensing speed (i.e. current), an increase in storage capacitor size (i.e. charge), and optimized capacitor area ratio (i.e. voltage).

| | Glossary of signal names: | |
|---|---|---|
| Signal | Acronym | Definition |
| BL | bit line | latch node connection to external circuitry |

-continued

Glossary of signal names:

| Signal | Acronym | Definition |
|---|---|---|
| BLB | bit line bar | complementary latch node connection to external circuitry |
| BOTPL | bottom plate line | common plate line connected to bottom of latch circuit 40 |
| CBL | cell bit line | internal latch node |
| CBLB | cell bit line bar | internal complementary latch node |
| LATCH | latch | active high latch control signal |
| LATCHB | latch bar | active low latch control signal |
| NNODE | n node | controlled latch power supply connected to NMOS devices in latch circuit 40 |
| PLBL | plate line (bit line) | plate line node for ferroelectric storage capacitor connected to CBL |
| PLBLB | plate line (bit line bar) | plate line node for ferroelectric storage capacitor connected to CBLB |
| PLGOB | plate line go bar | signal which falls to trigger PLBL and PLBLB pulse in latch circuit 20 |
| PNODE | p node | controlled latch power supply connected to PMOS devices in latch circuit 40 |
| TOPPL | top plate line | common plate line connected to top of latch circuit 40 |
| VDDP | $V_{DD}$ prime | controlled power supply level |
| WL | word line | active high control signal connected to gates of access devices |

Having described and illustrated the principle of the invention in a preferred embodiment thereof, it is appreciated by those having skill in the art that the invention can be modified in arrangement and detail without departing from such principles. For example, capacitor ratios, capacitor sizes and values, signal timing, sensing methods, and the nature and number of control signals can be changed as required. We therefore claim all modifications and variations coming within the spirit and scope of the following claims.

We claim:

1. A non-volatile ferroelectric latch comprising:
    a sense amplifier having first and second input/outputs coupled respectively coupled to first and second internal bit-line nodes;
    a pair of balanced ferroelectric capacitors coupled between the first and second internal bit-line nodes; and
    isolation circuitry coupled between the first and second internal bit-line nodes and first and second external bit-line nodes.

2. The non-volatile ferroelectric latch as in claim 1 in which the pair of balanced ferroelectric capacitors comprises:
    a first ferroelectric capacitor having a top electrode coupled to the first internal bit-line node, and a bottom electrode coupled to the second internal bit-line node; and
    a second ferroelectric capacitor having a bottom electrode coupled to the first internal bit-line node, and a top electrode coupled to the second internal bit-line node.

3. The non-volatile ferroelectric latch as in claim 1 in which the isolation circuitry comprises:
    a first transistor having a gate and a current path coupled between first internal bit-line node and the first external bit-line node; and
    a second transistor having a gate and a current path coupled between the second internal bit-line node and the second external bit-line node,
    wherein the gates of the first and second transistors are coupled to a word-line node.

4. The non-volatile ferroelectric latch as in claim 1 further comprising means for selectively powering the sense amplifier.

5. The non-volatile ferroelectric latch comprising:
    a sense amplifier having first and second input/outputs coupled respectively coupled to first and second internal bit-line nodes;
    a first ferroelectric capacitor coupled between a first plate-line node and the first internal bit-line node;
    a second ferroelectric capacitor coupled between a second plate-line node and the second internal bit-line node;
    a first load element coupled between the first internal bit-line node and ground;
    a second load element coupled between the second internal bit-line node and ground;
    control circuitry coupled to the first and second plate-line nodes and to the first and second internal bit-line nodes; and
    isolation circuitry coupled between the first and second internal bit-line nodes and the first and second external bit-line nodes.

6. The non-volatile ferroelectric latch as in claim 5 in which the first and second load elements each comprise a ferroelectric capacitor or a linear capacitor.

7. The non-volatile ferroelectric latch as in claim 5 in which the control circuitry comprises:
    a first controlled transistor having a current path coupled between a source of supply voltage and the first plate-line node;
    a second controlled transistor having a current path coupled between the source of supply voltage and the second plate-line node;
    a first controlled transmission gate having a current path coupled between the first plate-line node and the second internal bit-line node; and
    a second controlled transmission gate having a current path coupled between the second plate-line node and the first internal bit-line node.

8. The non-volatile ferroelectric latch as in claim 5 in which the control circuitry comprises:
    a first inverter having a current path, an input coupled to the first internal bit-line node, and an output coupled to the first plate-line node;
    a second inverter having a current path, an input coupled to the second internal bit-line node, and an output coupled to the second plate-line node;
    a first controlled transistor having a current path in series with the current path of the first inverter; and
    a second controlled transistor having a current path in series with the current path of the second inverter.

9. The non-volatile ferroelectric latch as in claim 8 in which the first and second controlled transistors are controlled by a control signal applied to a gate of each of the first and second transistors.

10. The non-volatile ferroelectric latch as in claim 8 in which the first and second controlled transistors are controlled by a signal on the first and second internal bit-line nodes respectively applied to the gates of the first and second transistors.

11. The non-volatile ferroelectric latch as in claim 5 in which the isolation circuitry comprises:
    a first transistor having a gate and a current path coupled between first internal bit-line node and the first external bit-line node; and a second transistor having a gate and a current path coupled between the second internal bit-line node and the second external bit-line node, wherein the gates of the first and second transistors are coupled to a word-line node.

12. The non-volatile ferroelectric latch comprising:

a sense amplifier having first and second input/outputs respectively coupled to first and second internal bit-line nodes;

a first ferroelectric capacitor coupled between a first plate-line node and the first internal bit-line node;

a second ferroelectric capacitor coupled between the first plate-line node and the second internal bit-line node;

a first load element coupled between the first internal bit-line node and a second plate-line node;

a second load element coupled between the second internal bit-line node and the second plate-line node; and isolation circuitry coupled between the first and second internal bit-line nodes and the first and second external bit-line nodes.

13. The non-volatile ferroelectric latch as in claim 12 in which the first and second load elements each comprise a ferroelectric capacitor or a linear capacitor.

14. The non-volatile ferroelectric latch as in claim 12 in which the isolation circuitry comprises:

a first transistor having a gate and a current path coupled between first internal bit-line node and the first external bit-line node; and a second transistor having a gate and a current path coupled between the second internal bit-line node and the second external bit-line node, wherein the gates of the first and second transistors are coupled to a word-line node.

15. The non-volatile ferroelectric latch as in claim 12 further comprising means for selectively powering the sense amplifier.

16. The non-volatile ferroelectric latch comprising:

a first controlled sense amplifier having first and second input/outputs respectively coupled to first and second internal bit-line nodes;

a second controlled sense amplifier having first and second input/outputs respectively coupled to first and second plate-line nodes;

a first ferroeiectric capacitor coupled between the first plate-line node and the first internal bit-line node;

a second ferroelectric capacitor coupled between the second plate-line node and the second internal bit-line node;

a first load element coupled between the first internal bit-line node and ground;

a second load element coupled between the second internal bit-line node and ground; and isolation circuitry coupled between the first and second internal bit-line nodes and first and second external bit-line nodes.

17. The non-volatile ferroelectric latch as in claim 16 in which the first and second load elements each comprise a ferroelectric capacitor, a linear capacitor, or a resistive load.

18. The non-volatile ferroelectric latch as in claim 16 in which the isolation circuitry comprises:

a first transistor having a gate and a current path coupled between first internal bit-line node and the first external bit-line node; and a second transistor having a gate and a current path coupled between the second internal bit-line node and the second external bit-line node, wherein the gates of the first and second transistors are coupled to a word-line node.

19. The non-volatile ferroelectric latch as in claim 16 further comprising means for selectively powering the sense amplifiers.

20. The non-volatile ferroelectric latch as in claim 19 in which the means for selectively powering the sense amplifiers comprises:

a first control signal for driving a positive power terminal of the first sense amplifier;

a second control signal for driving a positive power terminal of the second sense amplifier; and a transistor having a drain coupled to a negative power terminal of the first sense amplifier and a negative power terminal of the second sense amplifier, and a gate for receiving the first control signal.

21. A non-volatile ferroelectric latch comprising:

a sense amplifier having at least one input/output coupled to a bit-line node;

a ferroelectric storage capacitor coupled between a plate-line node and the bit-line node; and a load element coupled to the bit-line node.

22. The non-volatile ferroelectric latch as in claim 21 in which the sense amplifier further includes a second input/output coupled to a second bit-line node and the latch further comprises:

a second ferroelectric storage capacitor coupled between a second plate-line node and the second bit-line node; and a second load element coupled to the second bit-line node.

23. The non-volatile ferroelectric latch as in claim 21 in which the load element comprises a dynamic, switched ferroelectric capacitor.

24. The non-volatile ferroelectric latch as in claim 21 in which the load element comprises a static, nonswitched ferroelectric capacitor.

25. The non-volatile ferroelectric latch as in claim 21 in which the load element comprises a linear capacitor.

26. The non-volatile ferroelectric latch as in claim 21 in which the load element comprises a resistive load.

27. The non-volatile ferroelectric latch comprising:

a pair of isolated plate lines;

a sense amplifier having a pair of input/output nodes respectively coupled to the pair of plate lines;

a pair of ferroelectric capacitors respectively coupled between the plate lines and a pair of bit line nodes;

a load element pair coupled to the pair of bit line nodes; and circuitry for providing a complementary data state to the pair of bit line nodes.

28. The non-volatile latch as in claim 27 in which the load element comprises a pair of ferroelectric capacitors, a pair of linear capacitors, or a pair of resistive elements.

29. The non-volatile latch as in claim 27 in which the circuitry for providing a complementary data state comprises a circuit having a pair of inputs coupled to the plate lines and a pair of outputs coupled to the bit line nodes.

* * * * *